US012683549B2

(12) United States Patent
Speir et al.

(10) Patent No.: US 12,683,549 B2
(45) Date of Patent: Jul. 14, 2026

(54) LOCAL OSCILLATOR AMPLIFICATION WITH REDUCED HARMONIC GENERATION

(71) Applicant: BAE SYSTEMS Information and Electronic Systems Integration Inc., Nashua, NH (US)

(72) Inventors: Matthew Speir, Merrimack, NH (US); Mark E. Stuenkel, Goffstown, NH (US); Douglas S. Jansen, Durango, CO (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 292 days.

(21) Appl. No.: 18/672,506

(22) Filed: May 23, 2024

(65) Prior Publication Data

US 2025/0364949 A1     Nov. 27, 2025

(51) Int. Cl.
H04B 1/04 (2006.01)
H03B 1/04 (2006.01)

(52) U.S. Cl.
CPC ........... H03B 1/04 (2013.01); H03B 2202/05 (2013.01)

(58) Field of Classification Search
CPC ....... H03B 1/04; H03B 2202/05; H03D 7/165
See application file for complete search history.

(56) References Cited

U.S. PATENT DOCUMENTS 4,887,313 A * 12/1989 Luke .................... H01Q 3/2676
356/73.1

6,269,241 B1 * 7/2001 Masoian .................. H04B 1/18
455/313

(Continued)

FOREIGN PATENT DOCUMENTS

EP          1 735 905 B1     12/2006
WO     2011/156607 A1     12/2011

(Continued)

OTHER PUBLICATIONS

H. Morkner et al., "A complete transmit, receive, and LO buffer chip set in low cost SMT package covering 38 & 42 GHz applications," in IEEE MTT-S Int. Microw. Symp. Dig., Anaheim, CA, May 23-28, 2010, pp. 133-136.

(Continued)

*Primary Examiner* — Angelica Perez
(74) *Attorney, Agent, or Firm* — Scott J. Asmus

(57)          ABSTRACT

Techniques for reducing harmonics of a local oscillator (LO) signal. A methodology implementing the techniques according to an embodiment includes splitting an LO signal into first and second LO signals using a passive splitting circuit. The method also includes generating one of either a first enable signal or a second enable signal based on the LO signal frequency. The method further includes amplifying and filtering the first LO signal to generate a first band LO signal, in response to the first enable signal, and amplifying and filtering the second LO signal to generate a second band LO signal, in response to the second enable signal. The method further includes combining, using a passive Wilkinson combiner, output paths of the first band processing circuit and the second band processing circuit to provide either the first band LO signal or the second band LO signal as a reduced harmonic LO signal.

20 Claims, 5 Drawing Sheets

Receiver/Transmitter Frequency Converter
100

(56) References Cited

U.S. PATENT DOCUMENTS

| | | | |
|---|---|---|---|
| 6,400,305 B1 * | 6/2002 | Kuhn ..................... G01S 7/022 | |
| | | | 455/228 |
| 7,130,604 B1 | 10/2006 | Wong et al. | |
| 7,146,136 B2 | 12/2006 | Consolazio | |
| 7,821,581 B2 | 10/2010 | Vorenkamp et al. | |
| 7,933,555 B2 | 4/2011 | Moloudi | |
| 8,521,221 B2 | 8/2013 | Lu et al. | |
| 8,907,712 B2 | 12/2014 | Cho et al. | |
| 9,356,561 B2 | 5/2016 | Brown et al. | |
| 9,356,634 B2 | 5/2016 | Din et al. | |
| 9,407,379 B2 | 8/2016 | Lau et al. | |
| 9,529,380 B1 * | 12/2016 | Rong ..................... H03B 27/00 | |
| 9,634,773 B2 | 4/2017 | Deng et al. | |
| 10,171,034 B2 | 1/2019 | Tseng et al. | |
| 10,250,200 B2 | 4/2019 | Torre et al. | |
| 10,516,426 B1 * | 12/2019 | Wyse ................... H04B 1/1036 | |
| 11,431,358 B2 | 8/2022 | Park et al. | |
| 2003/0060160 A1 * | 3/2003 | Yuan ................... H03D 7/1408 | |
| | | | 455/12.1 |
| 2004/0092245 A1 * | 5/2004 | Katz ........................ H04B 1/30 | |
| | | | 455/318 |
| 2006/0040634 A1 | 2/2006 | Wang | |
| 2013/0033330 A1 * | 2/2013 | Longstone ................ H03L 7/22 | |
| | | | 331/40 |
| 2013/0243113 A1 | 9/2013 | Taghivand | |
| 2017/0207855 A1 * | 7/2017 | Clark, Jr. ............... H04B 10/00 | |
| 2018/0262218 A1 * | 9/2018 | Eng ...................... H04B 1/1036 | |
| 2022/0085834 A1 | 3/2022 | Huang et al. | |
| 2022/0171022 A1 * | 6/2022 | Bourde ................. G01S 7/4056 | |
| 2023/0043914 A1 | 2/2023 | Ko et al. | |
| 2024/0214016 A1 * | 6/2024 | Patel ........................ H04B 1/10 | |
| 2024/0388265 A1 * | 11/2024 | Trayling .................. H04B 1/04 | |

FOREIGN PATENT DOCUMENTS

| | | | |
|---|---|---|---|
| WO | 2014/100668 A1 | 6/2014 | |
| WO | 2015/047942 A1 | 4/2015 | |
| WO | 2017/023479 A1 | 2/2017 | |
| WO | 2023/277351 A1 | 1/2023 | |

OTHER PUBLICATIONS

P. S. Crovetti, "Finite common-mode rejection in fully differential nonlinear circuits," IEEE Transactions on Circuits and Systems II: Express Briefs, vol. 58, No. 8, pp. 507-511, Aug. 2011.

* cited by examiner

Receiver/Transmitter Frequency Converter
100

Harmonic Reduction System
130

Band Processor Circuit
210

400

Processing Platform
500

LOCAL OSCILLATOR AMPLIFICATION WITH REDUCED HARMONIC GENERATION

FIELD OF DISCLOSURE

The present disclosure relates to local oscillators (LOs), and more particularly to the generation of amplified LO signals with reduced harmonics.

BACKGROUND

Local oscillators generate a stable frequency signal, which can be used in a number of applications. For example, the signal can be used as a clock signal (or to generate a clock signal) for synchronizing functions of a given circuit, or in a radio frequency (RF) heterodyning process in which the signal (e.g., sometimes referred to as an LO signal) is mixed with a received RF signal of interest to frequency down-convert that received RF signal to an intermediate frequency (IF) band or to baseband. The LO signal may be amplified before mixing.

Figure 1:
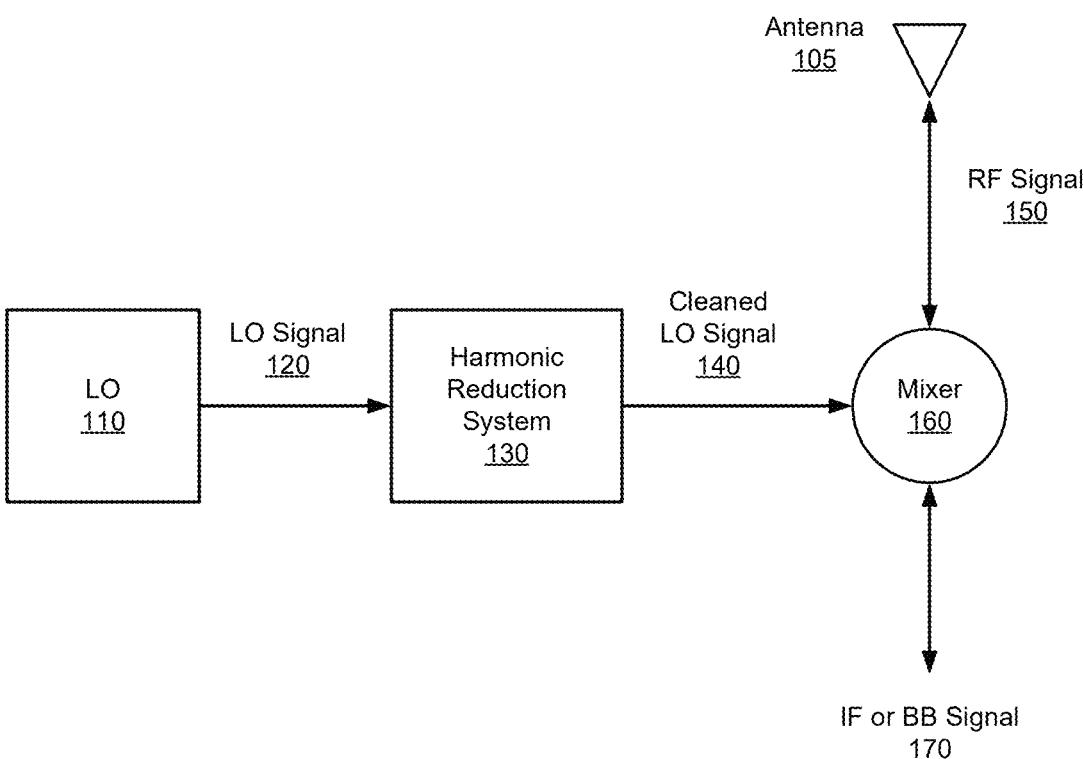
FIG. 1 illustrates a frequency converter employing a harmonic reduction system, configured in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

Techniques are provided herein for reducing harmonics of a local oscillator signal. As noted above, local oscillator signals can be used in a number of applications, including RF receiver applications where the local oscillator signal (or LO signal) is mixed with a received RF signal of interest to frequency down-convert the received signal from an RF band to an IF band or to baseband. Similarly, the LO signal can be mixed with an IF band or baseband signal to up-convert the signal to an RF band for transmission. Some applications may call for amplification of the LO signal prior to its application to the mixer. Such amplification of the LO signal before mixing can introduce in-band harmonic spurs, due to non-linear operation of the amplifier (which may also be referred to as a buffer). These spurs can be difficult to remove and can degrade the performance of the receiver. For example, in an application where the LO signal is required to range between 10 Gigahertz (GHz) and 25 GHz, amplification of the LO signal at 10 GHz can introduce a second harmonic at 20 GHz. A 20 GHz filter could be employed to reduce the harmonic, however if the LO needs to be re-tuned to 20 GHz to frequency convert a different signal of interest at 20 GHz, that filter will degrade or interfere with the re-tuned LO signal. Additionally, it can be difficult or impractical to implement a tunable filter with a wide tuning range and sharp cut-off frequencies on an integrated circuit (e.g., system-on-a-chip) design. More generally, when the frequency range of the LO is large enough that the second harmonic of an LO frequency at the low end of the range cannot be filtered out due to overlap with an LO frequency at the high end of the range, amplification of the LO signal to feed a mixer can be problematic. For example, the second harmonic can mix with the RF signal to create an in-band spur in the IF or baseband output of the mixer.

To this end, and in accordance with an embodiment of the present disclosure, a system architecture is disclosed to remove or reduce harmonics from the LO generation process while still allowing the LO to operate over a relatively wide bandwidth. In some examples, the system is configured to split the LO signal N ways and feed each of the copies into N band processing circuits that operate in different frequency bands, wherein N is an integer of 2 or more. Each of the band processing circuits is configured to perform amplification and harmonic filtering, but only one of the band processing circuits is selected to operate at any given time based on the frequency of the LO signal. The outputs of the N band processing circuits, only one of which will have a signal, are then combined, passively and linearly, to generate an amplified but "clean" version of the LO signal that has reduced harmonics. In some embodiments, reduction of the second harmonic is of particular concern since that harmonic is larger and closer in frequency to the fundamental frequency of the LO signal than higher order harmonics and it can mix with the RF signal to create in-band spurs at the IF or baseband output frequency of the mixer (or at RF during upconversion).

In accordance with an embodiment, a methodology implementing the techniques for reducing harmonics of an LO signal includes splitting an LO signal into a first LO signal and a second LO signal using a passive splitting circuit. The method also includes generating one of either a first enable signal or a second enable signal based on the frequency of the LO signal. The method further includes amplifying and filtering the first LO signal, by a first band processing circuit, to generate an amplified first band LO signal, in response to the first enable signal. The method further includes amplifying and filtering the second LO signal, by a second band processing circuit, to generate an amplified second band LO signal, in response to the second enable signal. The method further includes combining the output paths of the first and second band processing circuits, using a passive combiner, to provide either the first band LO signal or the second band LO signal as the amplified LO signal with reduced harmonics.

It will be appreciated that the techniques described herein may provide improved frequency conversion performance in an RF receiver or transmitter, compared to other methods that either omit LO signal amplification or allow harmonics of the LO signal to be introduced into the mixing process. More generally, any number of circuit applications that utilize an amplified local oscillator signal may benefit from the techniques described herein. Numerous embodiments and applications will be apparent in light of this disclosure. System Architecture FIG. 1 illustrates a receiver/transmitter frequency converter 100 employing a harmonic reduction system 130, configured in accordance with certain embodiments of the present disclosure. The up/downconverter is shown to include an antenna 105, an LO 110, the harmonic reduction system 130, and a mixer 160.

For operation as a downconverter, the antenna 105 is configured to receive RF signals 150 such as, for example, radar signals, communication signals, navigation signals, etc.

The LO 110 is configured to generate a sinusoidal waveform signal 120 at a desired frequency for mixing (e.g., a fundamental frequency). In some embodiments, the frequency of the LO signal 120 may be tuned to a value within a range of 25 GHz to 51 GHz, although any other desired frequency range may be used. In some embodiments the LO may be implemented as a phase lock loop or any other suitable type of signal generator.

The harmonic reduction system 130 is configured to amplify the LO signal 120 to a level that can properly drive the mixer 160, while reducing harmonics that would otherwise be generated by the amplification process, as will be described in greater detail below.

The mixer 160 is configured to mix the amplified and "cleaned" LO signal 140 with the RF signal 150 to downconvert that RF signal to an IF band or to baseband 170 so that further application specific processing can be performed on the down-converted signal.

For operation as an upconverter, the mixer 160 is configured to mix the amplified and "cleaned" LO signal 140 with a baseband or IF signal 170 to up-convert that signal to an RF signal 150 to be provided to the antenna 105 for transmission.

In some embodiments, one or more of the LO 110, the harmonic reduction system 130, and the mixer 160 may be implemented in an application specific integrated circuit or an RF system on a chip.

Figure 2:
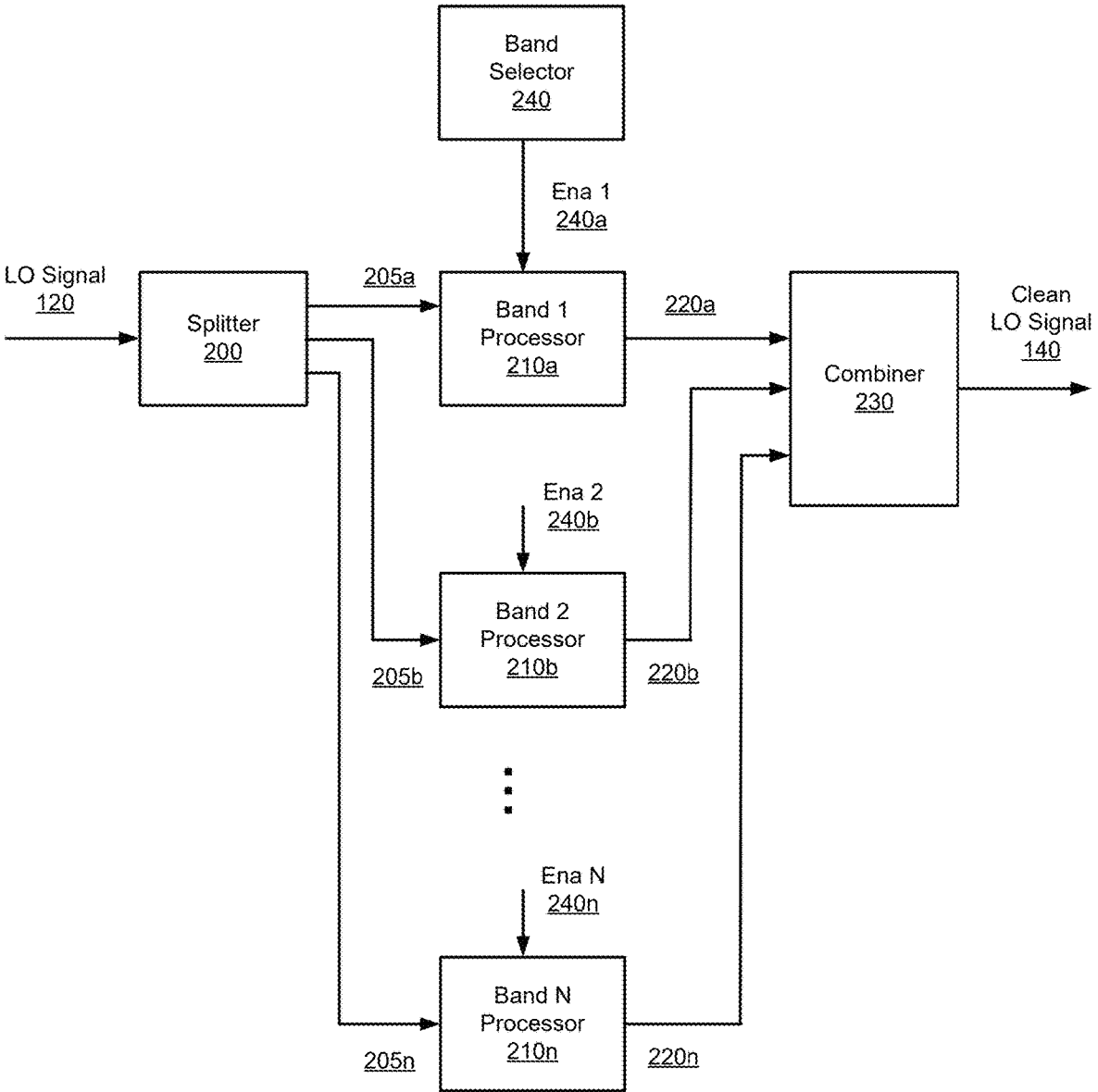
FIG. 2 is a block diagram of the harmonic reduction system of FIG. 1, configured in accordance with certain embodiments of the present disclosure.

FIG. 2 is a block diagram of the harmonic reduction system 130 of FIG. 1, configured in accordance with certain embodiments of the present disclosure. The harmonic reduction system 130 is shown to include a splitter 200, a band selector 240, N band processing circuits 210a, . . . 210n, and a combiner 230.

The splitter 200 is configured to split the LO signal 120 into a desired number of signals 205 (e.g., a first LO signal 205a, a second LO signal 205b, . . . an N$^{th}$ LO signal 205n). Each of the split LO signals 205 are substantially the same as the LO signal 120, although at a reduced power. For example, in a two way split each of the split LO signals 205 may be approximately half the power of the LO signal 120, and in a three way split each of the split LO signals 205 may be approximately one third the power of the LO signal 120, and in a four way split each of the split LO signals 205 may be approximately one quarter the power of the LO signal 120, and so on. The splitter 200 is implemented as a passive circuit to avoid introducing additional harmonics. For example, in some embodiments, the splitter 200 may be implemented as a resistive divider network. In still other examples, an active splitter that does not introduce harmonics of concern may be used, or those harmonics may be filtered out in the band processing circuits.

The LO signal 120 is split into N substantially identical copies 205 so that a selected one of N band processing circuits 210 can operate on one of the copies to perform amplification and harmonic filtering, as described below. Each of the N band processing circuits operate over a different subband of the total frequency range of the LO 110 such that, for a given LO frequency, the LO fundamental and the LO harmonic are not in the same subband so that the harmonic can be filtered without affecting the LO fundamental, as will be explained in greater detail below.

In some embodiments, each of the subbands are selected to be sub-octave in tuning range allowing the harmonics to be easily removed using a passive fixed frequency filter so that those harmonics do not generate spurs in the IF from mixing with the RF signal. Additionally, sub-octave bandwidths allow fixed frequency filters to remove the second harmonic of the lowest LO frequency without impacting the performance of the highest LO frequency, since filter cutoff frequency corners will lie above that frequency. In some embodiments, the different subbands can overlap to some degree to avoid signal degradation at band edges.

The band selector 240 is configured to determine which of the band processing circuits 210 will be used by generating enable signals 240 (e.g., a first enable signal 240a, a second enable signal 240b, . . . an N$^{th}$ enable signal 240n) based on the frequency of the LO signal 120. For example, if the frequency of the LO signal is in the frequency band associated with the first band processing circuit 210a then the first enable signal 240a is generated.

The band selector 240 may determine the frequency of the LO signal 120 using any suitable technique. For example, in some embodiments, the frequency of the LO signal 120 may be controlled by a processor (or other application specific component of the receiver), and the band selector 240 may determine the LO frequency based on observation of control signals provided by the processor to the LO 110. In some other embodiments, the band selector 240 may determine the LO frequency based on a frequency analysis of the LO signal 120.

The band processing circuits 210 are coupled to the splitter outputs and are configured to amplify and filter the associated split LO signal 205 in response to an enable signal 240 directed to that band processing circuit. For example, the first band processing circuit 210a is configured to amplify and filter the first LO signal 205a to generate a first band LO signal 220a, in response to the first enable signal 240a. Similarly, the second band processing circuit 210b is configured to amplify and filter the second LO signal 205b to generate a second band LO signal 220b, in response to the second enable signal 240b.

In some embodiments, the frequency bands for each band processing circuit are selected so that the LO and the harmonic are not in the same band. For example, if the LO is required to operate over a range of 10 GHz to 25 GHz, two bands may be selected, the first to cover the range of 10-17.5 GHz, the second to cover the range of 17.5-25 GHz. When the LO is operating in the first band, the second harmonic will be in the second band (or out of both bands) and can be filtered. Likewise, when the LO is operating in the second band, the second harmonic will be above both bands and can be filtered. More generally, the total LO frequency range may be divided into sub-octave bands to eliminate LO overlap between bands, allowing fixed frequency filters to remove all harmonics in each subband. The fact that a second harmonic of a low frequency LO might overlap with a high frequency LO in itself is not a problem, but if that second harmonic mixes with the RF signal in some cases, that can generate an in band spur at IF. To prevent this, in a wide tuning range system, the second (and higher) LO harmonics are suppressed after non-linear amplification.

The combiner circuit 230 is coupled to the outputs of the band processing circuits 210 and configured to combine the output paths to allow whichever one of the outputs 220a, 220b, . . . 220n that are active (based on the enable signal 240) to be provided as the reduced harmonic (or "clean") LO signal 140. In some embodiments, the harmonic may be reduced by 20 dB or more. In some embodiments, the combiner circuit is a Wilkinson combiner, which is a passive linear circuit that does not re-introduce additional harmonics to the combined signal.

Figure 3:
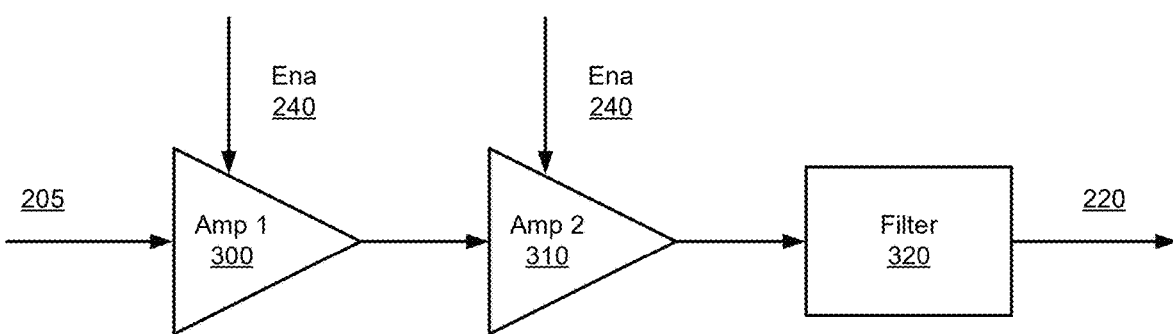
FIG. 3 is a block diagram of a band processor of the harmonic reduction system of FIG. 2, configured in accordance with certain embodiments of the present disclosure.

FIG. 3 is a block diagram of band processing circuits 210 of harmonic reduction system 130 of FIG. 2, configured in accordance with certain embodiments of the present disclosure. The band processing circuits 210 are shown to include a first amplifier 300, a second amplifier 310, and a filter 320.

The first amplifier 300 is configured to amplify the split LO signal 205 if the enable signal 240 is present. The second amplifier 310 is coupled to the output of the first amplifier 300 and is configured to provide additional amplification (if the enable signal 240 is present). The combination of amplification provided by the two amplifiers 300 and 310 provides the amplification required to drive the mixer 160 in addition to compensating for power losses incurred by the passive splitter and passive combiner. In some embodiments, the combination of the two amplifiers, in series, provides the characteristics of a logarithmic amplifier which allows for a broader input power range from the of LO 110.

Because each of the band processing circuits 210a, 210b, . . . 210n cover different frequency bands and bandwidths, the design of the amplifiers in those band processing circuits can, in some embodiments, be more specifically tailored to those frequency bands. This may simplify the design, reduce cost, and provide improved performance, compared to an amplifier designed to handle the entire frequency range of the LO 110.

The filter 320 is coupled to the output of the second amplifier 310 and is configured to filter out the harmonics generated by the amplifiers 300 and 310. In some embodiments, the filter is implemented as a high pass filter or a low pass filter having cutoff frequencies selected to reduce the harmonics while preserving the fundamental frequency of the amplified LO signal. In some embodiments, the filter is implemented as a notch filter centered at the frequency of the harmonics of the amplified LO signal. Use of a notch filter may provide relatively sharper cutoff edges.

Methodology

Figure 4:
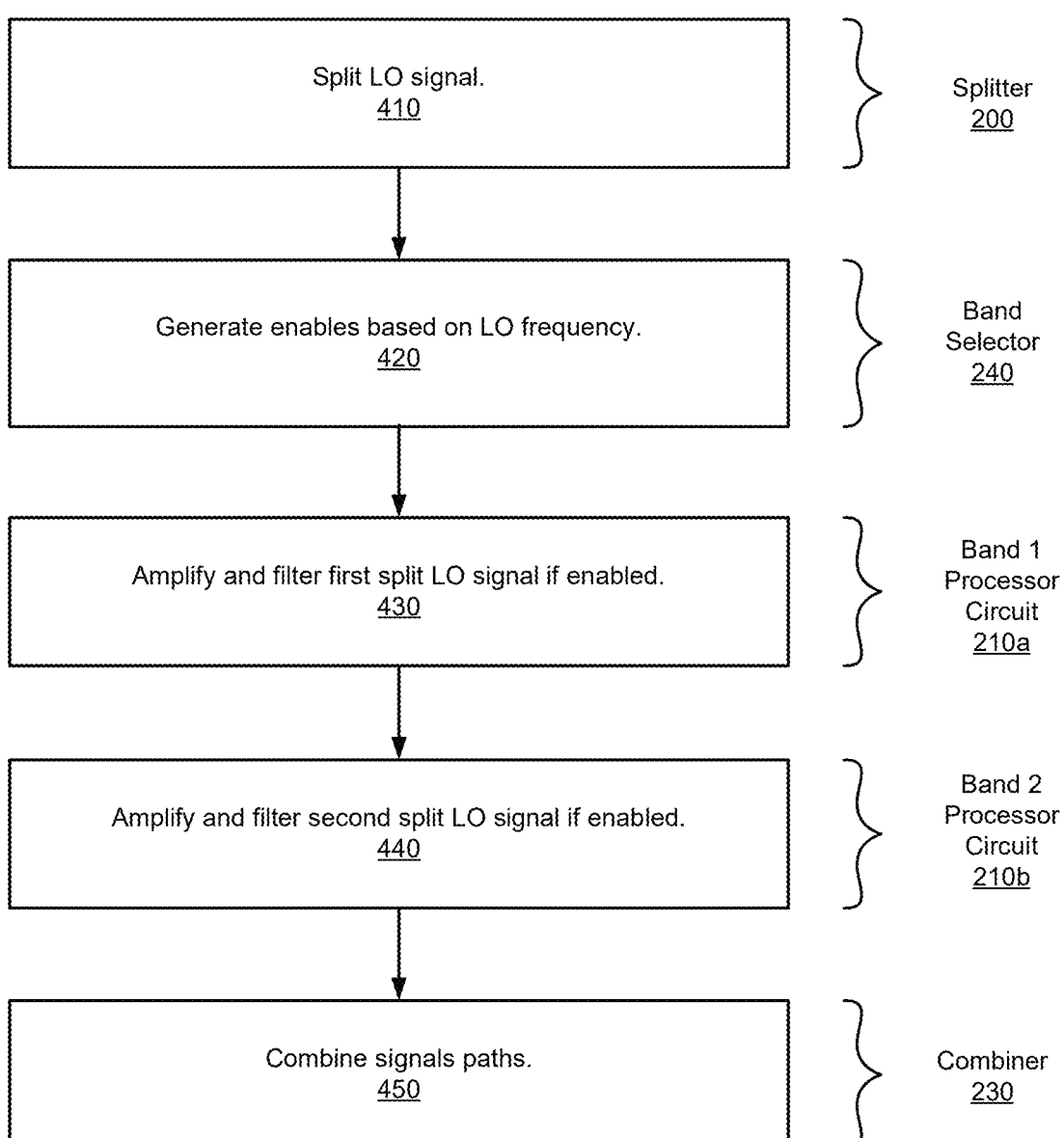
FIG. 4 is a flowchart illustrating a methodology for harmonic reduction, in accordance with an embodiment of the present disclosure.

FIG. 4 is a flowchart illustrating a methodology 400 for harmonic reduction, in accordance with an embodiment of the present disclosure. As can be seen, example method 400 includes a number of phases and sub-processes, the sequence of which may vary from one embodiment to another. However, when considered in aggregate, these phases and sub-processes form a process for operation of the harmonic reduction system 130, in accordance with certain of the embodiments disclosed herein, for example as illustrated in FIGS. 1-3, as described above. However other system architectures can be used in other embodiments, as will be apparent in light of this disclosure. To this end, the correlation of the various functions shown in FIG. 4 to the specific components illustrated in the figures, is not intended to imply any structural and/or use limitations. Rather other embodiments may include, for example, varying degrees of integration wherein multiple functionalities are effectively performed by one system. Numerous variations and alternative configurations will be apparent in light of this disclosure.

In one embodiment, method 400 commences, at operation 410, by splitting a local oscillator (LO) signal into a first LO signal and a second LO signal. The splitting may be performed by a passive resistive divider network to avoid introduction of additional harmonics.

At operation 420, a band selector generates one of either a first enable signal or a second enable signal based on the frequency of the LO signal. For example, if the frequency of the LO signal lies in a first band, the first enable signal is generated, while if the frequency of the LO signal lies in a second band, the second enable signal is generated.

At operation 430, the first LO signal is amplified and filtered, by a first band processing circuit, to generate a first band LO signal, in response to the first enable signal (e.g., if enabled). In some embodiments, a notch filter may be used to filter out the harmonic of the first LO signal generated by amplification of the first LO signal.

At operation 440, the second LO signal is amplified and filtered, by a second band processing circuit, to generate a second band LO signal, in response to the second enable signal (e.g., if enabled). In some embodiments, a notch filter may be used to filter out the harmonic of the second LO signal generated by amplification of the second LO signal.

At operation 450, output paths of the first band processing circuit and the second band processing circuit are combined to provide either the first band LO signal or the second band LO signal as the reduced harmonic LO signal. In some embodiments, a passive Wilkinson combiner may be used to combine the output paths to avoid introduction of additional harmonics.

In some embodiments, additional operations may be performed, as previously described in connection with the system. For example, the system is not limited to only two bands (e.g., the first band and the second band described above). Any number of bands (N) may be implemented by splitting the LO signal N ways to feed N band processors that each cover a different frequency range.

EXAMPLE SYSTEM

Figure 5:
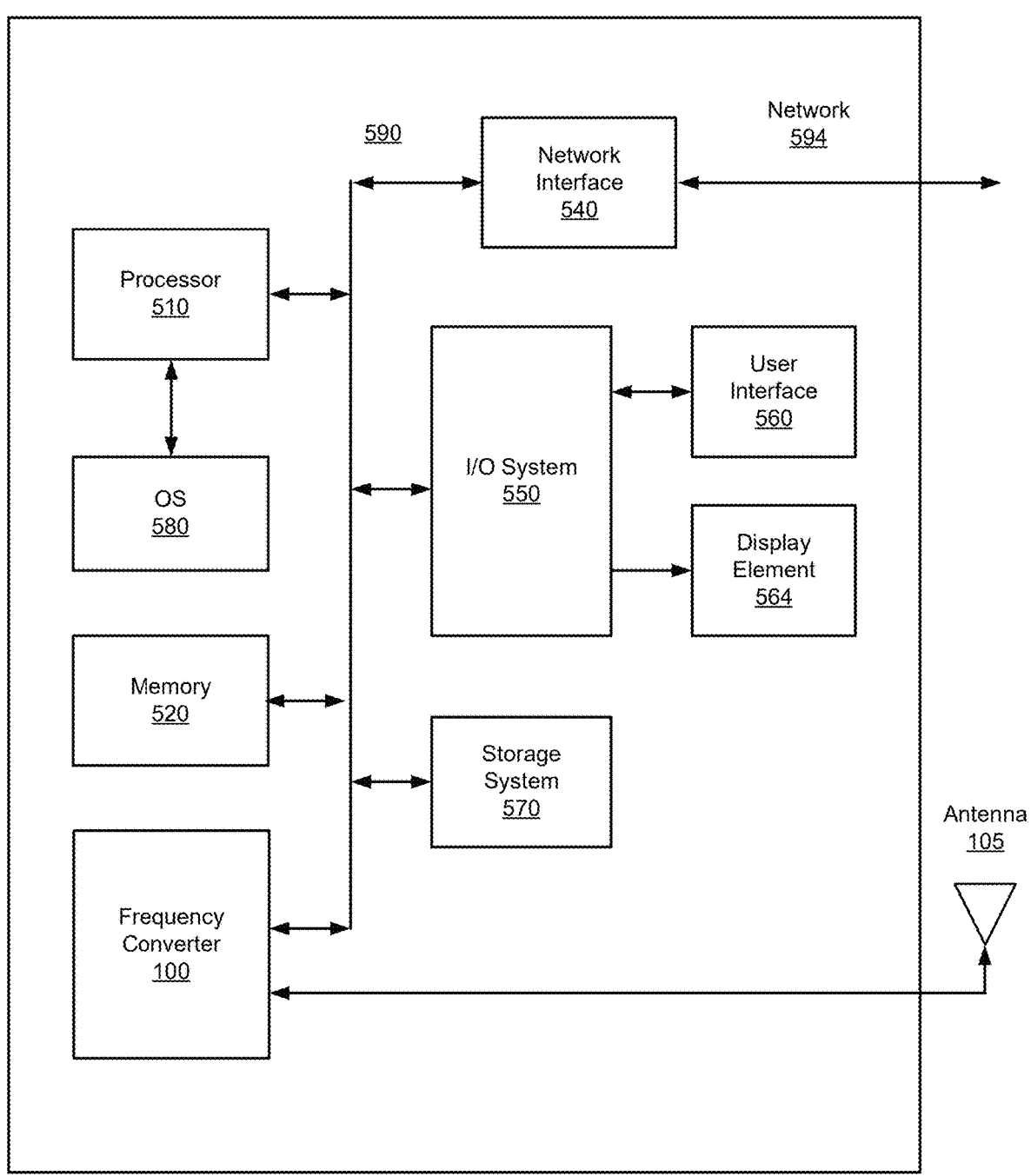
FIG. 5 is a block diagram of a processing platform configured to provide frequency conversion with harmonic reduction, in accordance with an embodiment of the present disclosure.

FIG. 5 is a block diagram of a processing platform 500 configured to provide frequency conversion with harmonic reduction, in accordance with an embodiment of the present disclosure. In some embodiments, platform 500, or portions thereof, may be hosted on, or otherwise be incorporated into an aircraft, the electronic systems of the aircraft, a ground vehicle, a ship, a tracking ground station, a personal computer, workstation, laptop computer, tablet, touchpad, portable computer, handheld computer, cellular telephone, smartphone, embedded system, or any other suitable platform where RF signals are received. Any combination of different devices may be used in certain embodiments.

In some embodiments, platform 500 may comprise any combination of a processor 510, memory 520, a network interface 540, an input/output (I/O) system 550, a user interface 560, a display element 564, a storage system 570, frequency converter 100 with harmonic reduction system 130, and antenna 105. As can be further seen, a bus and/or interconnect 590 is also provided to allow for communication between the various components listed above and/or other components not shown. Platform 500 can be coupled to a network 594 through network interface 540 to allow for communications with other computing devices, platforms, devices to be controlled, or other resources. Other componentry and functionality not reflected in the block diagram of FIG. 5 will be apparent in light of this disclosure, and it will be appreciated that other embodiments are not limited to any particular hardware configuration.

Processor 510 can be any suitable processor, and may include one or more coprocessors or controllers, such as an audio processor, a graphics processing unit, or hardware accelerator, to assist in the execution of mission software and/or any control and processing operations associated with platform 500, including operation of the frequency converter 100. In some embodiments, the processor 510 may be implemented as any number of processor cores. The processor (or processor cores) may be any type of processor, such as, for example, a micro-processor, an embedded processor, a digital signal processor (DSP), a graphics processor (GPU), a tensor processing unit (TPU), a network processor, a field programmable gate array or other device configured to execute code. The processors may be multi-threaded cores in that they may include more than one hardware thread context (or "logical processor") per core. Processor 510 may be implemented as a complex instruction set computer (CISC) or a reduced instruction set computer (RISC) processor. In some embodiments, processor 510 may be configured as an x86 instruction set compatible processor.

Memory 520 can be implemented using any suitable type of digital storage including, for example, flash memory and/or random access memory (RAM). In some embodiments, the memory 520 may include various layers of memory hierarchy and/or memory caches as are known to those of skill in the art. Memory 520 may be implemented as a volatile memory device such as, but not limited to, a RAM, dynamic RAM (DRAM), or static RAM (SRAM) device. Storage system 570 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device.

Processor 510 may be configured to execute an Operating System (OS) 580 which may comprise any suitable operating system, such as Google Android (Google Inc., Mountain View, CA), Microsoft Windows (Microsoft Corp., Redmond, WA), Apple OS X (Apple Inc., Cupertino, CA), Linux, or a real-time operating system (RTOS). As will be appreciated in light of this disclosure, the techniques provided herein can be implemented without regard to the particular operating system provided in conjunction with platform 500, and therefore may also be implemented using any suitable existing or subsequently-developed platform.

Network interface circuit 540 can be any appropriate network chip or chipset which allows for wired and/or wireless connection between other components of platform 500 and/or network 594, thereby enabling platform 500 to communicate with other local and/or remote computing systems, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution) and 5G, Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 550 may be configured to interface between various I/O devices and other components of platform 500. I/O devices may include, but not be limited to, user interface 560 and display element 564. User interface 560 may include devices (not shown) such as a touchpad, cockpit display unit, keyboard, and mouse, etc., for example, to allow the user to control the system. Display element 564 may be configured to display information to a user. I/O system 550 may include a graphics subsystem configured to perform processing of images for rendering on the display element 564. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 510 or any chipset of platform 500.

It will be appreciated that in some embodiments, the various components of platform 500 may be combined or integrated in a system-on-a-chip (SoC) architecture. In some embodiments, the components may be hardware components, firmware components, software components or any suitable combination of hardware, firmware, or software.

Frequency converter 100 is configured to down-convert a received RF signal to IF or baseband, (or to up-convert a baseband or IF signal to an RF band for transmission), using an LO mixing signal that is processed by harmonic reduction system 130, as described previously. Frequency converter 100 and harmonic reduction system 130 may include any or all of the circuits/components illustrated in FIGS. 1-3, as described above. These components can be implemented or otherwise used in conjunction with a variety of suitable software and/or hardware that is coupled to or that otherwise forms a part of platform 500. These components can additionally or alternatively be implemented or otherwise used in conjunction with user I/O devices that are capable of providing information to, and receiving information and commands from, a user.

In various embodiments, platform 500 may be implemented as a wireless system, a wired system, or a combination of both. When implemented as a wireless system, platform 500 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, platform 500 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 594. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments platform 500 may comprise additional, fewer, or alternative subcomponents as compared to those included in the example embodiment of FIG. 5.

The aforementioned non-transitory computer readable medium may be any suitable medium for storing digital information, such as a hard drive, a server, a flash memory, and/or random-access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method, process, and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smartphones, etc.

Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood, however, that other embodiments may be practiced without these specific details, or otherwise with a different set of details. It will be further appreciated that the specific structural and functional details disclosed herein are representative of example embodiments and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

Example 1 is a harmonic reduction system comprising: a splitter circuit configured to split a local oscillator (LO) signal into a first LO signal and a second LO signal; a band selector circuit configured to generate one of either a first enable signal or a second enable signal based on a frequency of the LO signal; a first band processing circuit coupled to the splitter circuit and configured to amplify and filter the first LO signal to generate a first band LO signal, in response to the first enable signal; a second band processing circuit coupled to the splitter circuit and configured to amplify and filter the second LO signal to generate a second band LO signal, in response to the second enable signal; and a combiner circuit coupled to the first band processing circuit and the second band processing circuit and configured to combine output paths of the first band processing circuit and the second band processing circuit to provide either the first band LO signal or the second band LO signal as a reduced harmonic LO signal.

Example 2 includes the system of Example 1, wherein the first band processing circuit comprises: an amplifier configured to amplify the first LO signal; and a filter coupled to the amplifier and configured to filter out a harmonic of the first LO signal generated by the amplifier.

Example 3 includes the system of Example 2, wherein the amplifier comprises two amplifiers coupled in series to provide logarithmic amplification.

Example 4 includes the system of Example 2, wherein the filter is a notch filter centered at the frequency of the harmonic of the amplified first LO signal.

Example 5 includes the system of any of Examples 1-4, wherein the combiner circuit is a Wilkinson combiner.

Example 6 includes the system of any of Examples 1-5, wherein the splitter circuit is a passive circuit.

Example 7 includes the system of Example 6, wherein the passive circuit is a resistive divider network.

Example 8 includes the system of any of Examples 1-7, wherein the second band processing circuit comprises: an amplifier configured to amplify the second LO signal; and a filter coupled to the amplifier and configured to filter out a harmonic of the second LO signal generated by the amplifier.

Example 9 includes the system of Example 8, wherein the amplifier comprises two amplifiers coupled in series to provide logarithmic amplification and the filter is a notch filter centered at the frequency of the harmonic of the amplified second LO signal.

Example 10 includes the system of any of Examples 1-9, wherein a frequency of the LO signal is in the range of 25 Gigahertz (GHz) to 51 GHz.

Example 11 includes the system of any of Examples 1-10, the system is implemented in an application specific integrated circuit.

Example 12 is a method for reducing harmonics, the method comprising: splitting a local oscillator (LO) signal into a first LO signal and a second LO signal; generating one of either a first enable signal or a second enable signal based on a frequency of the LO signal; amplifying and filtering, by a first band processing circuit, the first LO signal to generate a first band LO signal, in response to the first enable signal; amplifying and filtering, by a second band processing circuit, the second LO signal to generate a second band LO signal, in response to the second enable signal; and combining output paths of the first band processing circuit and the second band processing circuit to provide either the first band LO signal or the second band LO signal as a reduced harmonic LO signal.

Example 13 includes the method of Example 12, comprising using a notch filter to filter out a harmonic of the first LO signal generated by amplification of the first LO signal and using a notch filter to filter out a harmonic of the second LO signal generated by amplification of the second LO signal.

Example 14 includes the method of Examples 12 or 13, comprising using a Wilkinson combiner to combine the output paths of the first band processing circuit and the second band processing circuit.

Example 15 is a method for fabricating a harmonic reduction system, the method comprising: coupling a splitter circuit to a local oscillator (LO), the splitter circuit configured to split a signal from the LO into a first LO signal and a second LO signal; configuring a band selector circuit to generate one of either a first enable signal or a second enable signal based on a frequency of the LO signal; coupling a first band processing circuit to the splitter circuit, the first band processing circuit configured to amplify and filter the first LO signal to generate a first band LO signal, in response to the first enable signal; coupling a second band processing circuit to the splitter circuit, the second band processing circuit configured to amplify and filter the second LO signal to generate a second band LO signal, in response to the second enable signal; and coupling a combiner circuit to the first band processing circuit and the second band processing circuit, the combiner circuit configured to combine output paths of the first band processing circuit and the second band processing circuit to provide either the first band LO signal or the second band LO signal as a reduced harmonic LO signal.

Example 16 includes the method of Example 15, further comprising fabricating the first band processing circuit to comprise: an amplifier configured to amplify the first LO signal; and a notch filter coupled to the amplifier and configured to filter out a harmonic of the first LO signal generated by the amplifier.

Example 17 includes the method of Examples 15 or 16, further comprising fabricating the second band processing circuit to comprise: an amplifier configured to amplify the second LO signal; and a notch filter coupled to the amplifier and configured to filter out a harmonic of the second LO signal generated by the amplifier.

Example 18 includes the method of any of Examples 15-17, wherein the combiner circuit is a Wilkinson combiner.

Example 19 includes the method of any of Examples 15-18, wherein the splitter circuit is a passive resistive divider network.

Example 20 includes the method of any of Examples 15-19, wherein system is fabricated as an application specific integrated circuit.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A harmonic reduction system comprising:
a splitter circuit configured to split a local oscillator (LO) signal into a first LO signal and a second LO signal;
a band selector circuit configured to generate one of either a first enable signal or a second enable signal based on a frequency of the LO signal;
a first band processing circuit coupled to the splitter circuit and configured to amplify and filter the first LO signal to generate a first band LO signal, in response to the first enable signal;
a second band processing circuit coupled to the splitter circuit and configured to amplify and filter the second LO signal to generate a second band LO signal, in response to the second enable signal; and
a combiner circuit coupled to the first band processing circuit and the second band processing circuit and configured to combine output paths of the first band processing circuit and the second band processing circuit to provide either the first band LO signal or the second band LO signal as a reduced harmonic LO signal.

2. The system of claim 1, wherein the first band processing circuit comprises:
an amplifier configured to amplify the first LO signal; and a filter coupled to the amplifier and configured to filter out a harmonic of the first LO signal generated by the amplifier.

3. The system of claim 2, wherein the amplifier comprises two amplifiers coupled in series to provide logarithmic amplification.

4. The system of claim 2, wherein the filter is a notch filter centered at the frequency of the harmonic of the amplified first LO signal.

5. The system of claim 1, wherein the combiner circuit is a Wilkinson combiner.

6. The system of claim 1, wherein the splitter circuit is a passive circuit.

7. The system of claim 6, wherein the passive circuit is a resistive divider network.

8. The system of claim 1, wherein the second band processing circuit comprises:
an amplifier configured to amplify the second LO signal; and
a filter coupled to the amplifier and configured to filter out a harmonic of the second LO signal generated by the amplifier.

9. The system of claim 8, wherein the amplifier comprises two amplifiers coupled in series to provide logarithmic amplification and the filter is a notch filter centered at the frequency of the harmonic of the amplified second LO signal.

10. The system of claim 1, wherein a frequency of the LO signal is in the range of 25 Gigahertz (GHz) to 51 GHz.

11. The system of claim 1, the system is implemented in an application specific integrated circuit.

12. A method for reducing harmonics, the method comprising:
splitting a local oscillator (LO) signal into a first LO signal and a second LO signal;
generating one of either a first enable signal or a second enable signal based on a frequency of the LO signal;
amplifying and filtering, by a first band processing circuit, the first LO signal to generate a first band LO signal, in response to the first enable signal;
amplifying and filtering, by a second band processing circuit, the second LO signal to generate a second band LO signal, in response to the second enable signal; and
combining output paths of the first band processing circuit and the second band processing circuit to provide either the first band LO signal or the second band LO signal as a reduced harmonic LO signal.

13. The method of claim 12, comprising using a notch filter to filter out a harmonic of the first LO signal generated by amplification of the first LO signal and using a notch filter to filter out a harmonic of the second LO signal generated by amplification of the second LO signal.

14. The method of claim 12, comprising using a Wilkinson combiner to combine the output paths of the first band processing circuit and the second band processing circuit.

15. A method for fabricating a harmonic reduction system, the method comprising:
coupling a splitter circuit to a local oscillator (LO), the splitter circuit configured to split a signal from the LO into a first LO signal and a second LO signal;
configuring a band selector circuit to generate one of either a first enable signal or a second enable signal based on a frequency of the LO signal;
coupling a first band processing circuit to the splitter circuit, the first band processing circuit configured to amplify and filter the first LO signal to generate a first band LO signal, in response to the first enable signal;

coupling a second band processing circuit to the splitter circuit, the second band processing circuit configured to amplify and filter the second LO signal to generate a second band LO signal, in response to the second enable signal; and coupling a combiner circuit to the first band processing circuit and the second band processing circuit, the combiner circuit configured to combine output paths of the first band processing circuit and the second band processing circuit to provide either the first band LO signal or the second band LO signal as a reduced harmonic LO signal.

16. The method of claim 15, further comprising fabricating the first band processing circuit to comprise:

an amplifier configured to amplify the first LO signal; and a notch filter coupled to the amplifier and configured to filter out a harmonic of the first LO signal generated by the amplifier.

17. The method of claim 15, further comprising fabricating the second band processing circuit to comprise:

an amplifier configured to amplify the second LO signal; and a notch filter coupled to the amplifier and configured to filter out a harmonic of the second LO signal generated by the amplifier.

18. The method of claim 15, wherein the combiner circuit is a Wilkinson combiner.

19. The method of claim 15, wherein the splitter circuit is a passive resistive divider network.

20. The method of claim 15, wherein system is fabricated as an application specific integrated circuit.

* * * * *